(12) United States Patent
Chang et al.

(10) Patent No.: US 10,863,122 B2
(45) Date of Patent: Dec. 8, 2020

(54) CLOCK FEEDTHROUGH COMPENSATION IN IMAGE SENSOR SYSTEMS

(71) Applicant: Apple Inc., Cupertino, CA (US)

(72) Inventors: Nick Chang, Los Altos, CA (US); Mansour Keramat, Los Gatos, CA (US); Hyunsik Park, San Jose, CA (US); Brian Liebowitz, San Francisco, CA (US); Ashirwad Bahukhandi, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 5 days.

(21) Appl. No.: 16/272,283

(22) Filed: Feb. 11, 2019

(65) Prior Publication Data

US 2019/0373198 A1  Dec. 5, 2019

Related U.S. Application Data

(60) Provisional application No. 62/680,010, filed on Jun. 4, 2018.

(51) Int. Cl.

| | |
|---|---|
| *H04N 5/365* | (2011.01) |
| *H04N 5/374* | (2011.01) |
| *H04N 5/378* | (2011.01) |
| *H04N 5/369* | (2011.01) |
| *H03M 1/46* | (2006.01) |
| *H03M 1/06* | (2006.01) |

(52) U.S. Cl.
CPC ............ *H04N 5/365* (2013.01); *H03M 1/462* (2013.01); *H03M 1/466* (2013.01); *H04N 5/36963* (2018.08); *H04N 5/378* (2013.01); *H04N 5/3742* (2013.01); *H03M 1/0641* (2013.01); *H03M 1/0673* (2013.01); *H04N 5/379* (2018.08)

(58) Field of Classification Search
CPC ....... H04N 5/335–5/379; H01L 27/146; H01L 27/14616; H01L 27/14643; H01L 27/14645; H01L 27/14647
See application file for complete search history.

(56) References Cited

U.S. PATENT DOCUMENTS

| | | | |
|---|---|---|---|
| 6,762,401 | B2 | 7/2004 | Lee |
| 7,205,522 | B2 | 4/2007 | Krymski |
| 7,671,907 | B2 | 3/2010 | Kobayashi et al. |
| 8,730,364 | B2 | 5/2014 | Dai et al. |
| 8,736,684 | B1 | 5/2014 | Johansson et al. |
| 9,264,639 | B2 | 2/2016 | Guidash et al. |
| 9,406,713 | B2 | 8/2016 | Fan |
| 10,165,210 | B1 * | 12/2018 | Wang .................. H04N 5/3698 |
| 2015/0208008 | A1 * | 7/2015 | Gendai ................ H04N 5/3698 |
| | | | 250/208.1 |
| 2016/0366360 | A1 | 12/2016 | Okamoto et al. |

(Continued)

*Primary Examiner* — Paul M Berardesca
(74) *Attorney, Agent, or Firm* — Kowert, Hood, Munyon, Rankin & Goetzel, P.C.; Erik A. Heter

(57) ABSTRACT

A pixel circuit and method for operating the same is disclosed. The circuit includes a first driver circuit coupled to receive an analog pixel data, transfer signal and reset signal. The circuit further includes a source follower transistor having a source terminal coupled to a column node, and a gate terminal coupled to the first driver circuit. The circuit further includes a second driver circuit coupled to receive the transfer signal and the reset signal. The second driver circuit is capacitively coupled to the column node through a first capacitor.

20 Claims, 15 Drawing Sheets

(56) References Cited

U.S. PATENT DOCUMENTS

2019/0104267 A1\* 4/2019 Kobayashi ......... H04N 5/36963
2019/0373190 A1\* 12/2019 Kawazu ............. H04N 5/37213
2020/0014872 A1\* 1/2020 Kawazu ............ H01L 27/14612
2020/0021769 A1\* 1/2020 Niwa ................. H04N 5/36963

\* cited by examiner

| Pattern/Bit | B9 | B8 | B7 | B6 | B5 | B4 | B3 | B2 | B1 | B0 |
|---|---|---|---|---|---|---|---|---|---|---|
| Rpt4 | 1 | 1 | 1 | 2 | 1 | 1 | 2 | 2 | 2 | 2 |
| Rpt8 | 1 | 1 | 1 | 2 | 1 | 1 | 4 | 4 | 2 | 2 |

Fig. 12

CLOCK FEEDTHROUGH COMPENSATION IN IMAGE SENSOR SYSTEMS

PRIORITY CLAIM

This application claims priority to U.S. Provisional Application 62/680,010, entitled "Clock Feedthrough Compensation in Image Sensor Systems", filed Jun. 4, 2018, the disclosure of which is incorporated herein in its entirety.

BACKGROUND

Technical Field

This disclosure is directed to electronic systems, and more particularly, to image sensor systems.

Description of the Related Art

High quality image sensor systems have often utilized a single slope analog to digital converter (ADC) architecture due to its good uniformity, power efficiency and compactness. More recently, Successive Approximation Register (SAR) ADC architectures have been adopted for image sensor systems due to their speed benefit. The speed of a SAR ADC originates from the binary operation of a digital to analog converter (DAC) within the SAR ADC. On the other hand, in order to improve overall image system speed, the pixel settling is also important.

SUMMARY

A pixel circuit and method for operating the same is disclosed. In one embodiment, a circuit includes a first driver circuit coupled to receive a transfer signal and reset signal. The circuit further includes a source follower transistor having a source terminal coupled to a column node, and a gate terminal coupled to the first driver circuit. The circuit further includes a second driver circuit coupled to receive the transfer signal and the reset signal. The second driver circuit is capacitively coupled to the column node through a first capacitor.

In one embodiment, the first driver circuit conveys pixel data to the gate terminal of the source follower transistor responsive to assertion of the transfer signal. The source follower amplifies the voltage of the pixel data on the column node. The second driver circuit conveys the amplified or buffered reset or transfer signal to a terminal of the first capacitor responsive to assertion of the reset or transfer signal. Responsive to receiving the amplified or buffered reset or transfer signal on the first terminal, the capacitor conveys, through a second terminal, a controlled disturbance voltage onto the column node. Effectively, the capacitor provides feedforward path introducing zero to the single pole system.

BRIEF DESCRIPTION OF THE DRAWINGS

The following detailed description makes reference to the accompanying drawings, which are now briefly described.

FIG. 12 is a table illustrating repeat sampling patterns usable in one embodiment of an image sensing system.

Figure 1:
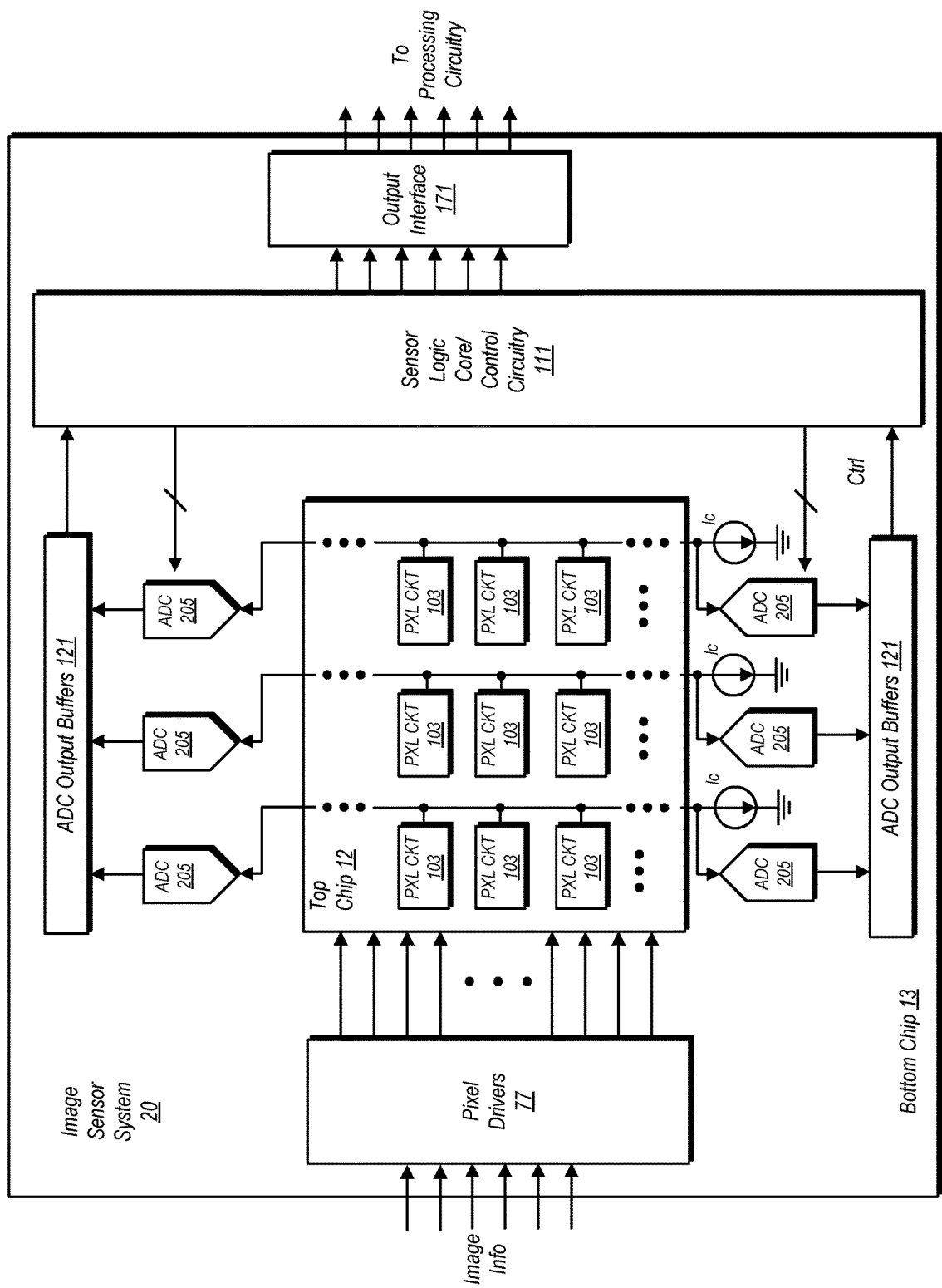
FIG. 1 is a diagram illustrating one embodiment of an image sensing system.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (e.g., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry, that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to various embodiments of an image sensor system. Various optimizations disclosed herein may allow an image sensor system to operate at greater speeds with less power consumption while reducing/minimizing the various sources of noise that can otherwise degrade image quality.

In various embodiments, an image sensor system accordingly to this disclosure includes pixel units each having a number of pixel circuits. The pixel circuits are coupled to provide pixel data to a comparator of a SAR ADC, via a multiplexer. In one embodiment, the pixel data is provided to the comparator as a continuous analog signal, as no sample-and-hold circuit is provided on that comparator input, which may reduce the impact of aliased thermal noise on the image quality. The other comparator input may receive, for a basis of comparison, an analog signal generated by a SAR ADC.

The SAR ADC may include a CDAC having a number of circuit elements used in generating the analog signal. For a given iteration, not all of the circuit elements are used. Furthermore, for any given iteration, the circuit elements of the CDAC may be randomly selected for use in generating the analog signal, and the random selection may occur within subsets that are independent (and thus orthogonal) from one another. Random selection of the elements may help to average out image noise that may result from an issue known as integral nonlinearity (INL).

Another nonlinearity issue differential nonlinearity (DNL) may be address through the application of a dithering signal to the same input as the analog signal output from the CDAC. In some embodiments, a separate DAC may be provided to generate the dithering signal, while in other embodiments, the circuitry for generating the dithering signal may be merged into the existing CDAC. Application of the dithering signal, which may be performed on a per-frame basis, may randomize systematic linearity errors in the CDAC and may improve DNL performance.

In some embodiments, the order in which pixel circuits are selected to provide pixel data for conversion to digital may be randomized. For example, if pixel circuits are arranged in columns, the selection of columns may be randomly shuffled from one frame to the next. The random selection of pixel circuits, through column shuffling or some other mechanism, may help reduce fixed patter noise that can otherwise reduce image quality.

Embodiments in which the pixel circuits include compensation circuitry are possible and contemplated. For example, a portion of the pixel circuitry may be replicated to provide a compensation circuit. Or simple buffer or amplifier circuits may be used. The main portion of the pixel circuit may be coupled to a source follower configured to amplify pixel data conveyed onto a column node (the column node being coupled directly to ADC or to a multiplexer which is in turn coupled to an ADC). The compensation circuit portion of the pixel circuit may be capacitively coupled to the column node, and may provide a disturbance voltage thereto. The disturbance voltage applied to the column node concurrent with the pixel data (via the source follower) may reduce the settling time of the column line. This may in turn reduce residue patterns that can result from clock feedthrough during operation of the pixel circuits.

Various power saving featured may be implemented in embodiments of the image sensor system disclosed herein. In one embodiment, the comparator of the ADC may be powered up when an ADC input is to be processed and powered down when input is not processed. A power enable signal may be slope-controlled such that the powering up and powering down of the comparator is likewise controlled. Powering the comparator up and down in a controlled manner may in turn reduce the occurrence and magnitude of power supply disturbances (e.g., voltage droops) from sudden changes in current demand (e.g., current surges). In image systems having multiple ADCs, the powering up and down of comparators in each may also be staggered relative to one another, further minimizing power supply disturbances. It is noted that many of the embodiments discussed herein utilize correlated double sampling (CDS), and as such, a given comparator may be powered up and down twice in performing a quantization process of pixel data provided from a corresponding pixel circuit.

With respect to the comparator of an ADC, various embodiments may include therein an integrate-and-reset pre-amplifier. This type of pre-amplifier may be optimized to the fundamental limit for a target signal-to-noise ratio (SNR) for the specific image sensor output signal by signal processing techniques regardless of ADC type.

To achieve good noise performance within power budgets, one embodiment may perform the quantization process using a weighted repeat with respect to some pixel circuits. That is, for selected ones of the pixel circuits, the quantization process may be repeated one or more times. The specific ones of the pixel circuits for which quantization may be determined through various mechanisms, such as trial and error. Performing the weighted repeat may allow for, e.g., reduced fixed pattern noise and reduced random noise for the fixed number of quantization.

Various embodiments of an image sensing system may implement some or all of the various method and apparatus embodiments discussed above and in further detail below.

Basic Image Sensor System:

Turning now to FIG. 1, a diagram illustrating one embodiment of a portion of an image sensor system is disclosed. In the embodiment shown, image sensor system 20 is implemented on an integrated circuit (IC) package having a stacked arrangement, including a top chip 12 and a bottom chip 13. It is noted however that the physical arrangement of a top chip and bottom chip as shown here is not intended to be limiting, but rather is one possible physical implementation. However, the various method and apparatus embodiments discussed herein may be implemented in any suitable manner. Furthermore, certain details of the image sensor system are not shown in FIG. 1, but will be illustrated in other figures discussed below or will otherwise become apparent upon reading this disclosure.

Although not explicitly shown here (for the sake of simplicity) sensors may capture image data (e.g., video or still frame pictures). The image information may be conveyed to pixel drivers 77 (which it is noted, are separate from the pixel drivers in pixel circuits 103 discussed below). These pixel drivers may provide image information for each pixel to pixel circuits 103 in top chip 12. Each of the pixel circuits 103 in the embodiment shown is in turn coupled to provide pixel data to an ADC 205. Current sources Ic may be provided in some embodiments to provide current on respective signal paths from which pixel data is conveyed form a pixel circuit 103 to an ADC 205. In various embodiments, the ADCs 205 may be implemented as SAR ADCs.

Each of the ADCs may convert pixel data, received in analog form, into a corresponding digital value. The digital values generated by the various ADCs 205 may in turn be provided to ADC output buffers 121, which provide temporary storage. From there, the digital values corresponding to sampled pixel data are conveyed to sensor logic core/control circuitry 111. The sensor logic core of this functional circuit unit may perform functions such as ordering of pixel data relative to other pixels in the captured frame. The control circuitry portion of this functional circuit block may generate and provide control signals for performing a number of different control functions, many of which are discussed below. These control functions include (but are not limited to) pixel circuit selection, CDAC circuit element selection, dithering signal generation, controlling the sampling operation, controlling the powering up and powering down of circuits and the manner in which it occurs, and so on.

Digitized pixel data may be conveyed from sensor logic core/control circuitry 111 to output interface 171, and subsequently to other processing circuitry which may utilize the image data in any suitable manner.

Figure 2:
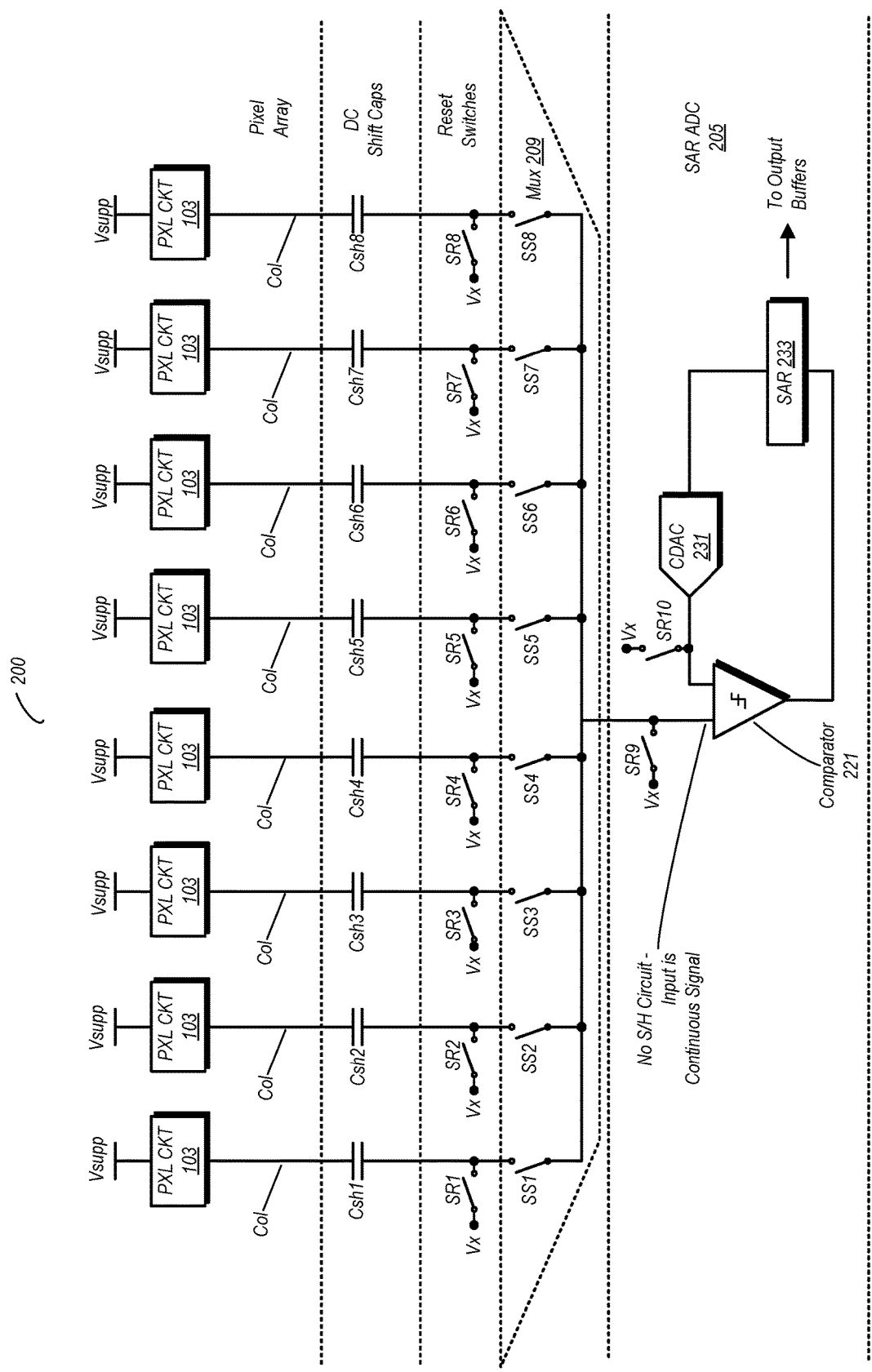
FIG. 2 is a diagram illustrating one embodiment of a group of multiplexed pixel units of an image sensing system.

FIG. 2 is a diagram illustrating one embodiment of a pixel unit 200. Although not explicitly shown in FIG. 1, each of the pixel circuits 103 shown therein may be associated with particular one of the SAR ADCs 205. As shown here, each of these pixel circuits may be arranged in, e.g., columns that are in turn coupled to a multiplexer 209. Each column may include DC shift capacitors, which includes Csh1-Csh8 in this particular example. These capacitors may block DC components of the pixel data conveyed on the column line (which may be alternatively referred to as a column node) mitigating the pixel's DC offset impact. Accordingly, pixel circuits 103 in this embodiment are AC coupled to SAR ADC 205, via multiplexer 209.

The number of pixel circuits 103, and corresponding shift capacitors in a pixel unit 200 may vary from one embodiment to the next. Each column is also coupled to a reset switch (SR1 through SR8 are shown in this example). These switches may be closed when it is desired to reset a given column line, such as between quantization of the pixel circuits.

Multiplexer 209 in the embodiment shown is a one-hot multiplexer including a number of switches, SS1-SS8. Other types of multiplexers may be implemented in lieu of this particular embodiment. When a given one of the switches is closed, pixel data from the correspondingly coupled pixel circuit may be conveyed from the column line, through the corresponding DC shift capacitor to SAR ADC 205. Control of the switches SS1-SS8 may be performed based on control signals generated from control circuitry, such as that in sensor logic core/control circuitry 111.

SAR ADC in the embodiment shown includes a comparator 221, which is configured to compare the respective amplitudes of the signals received on its inputs. Each of the inputs is coupled to a corresponding reset switch (SR9, SR10 as shown), which may be used to reset these circuit nodes similar to the resetting of the column nodes that may be performed. These inputs may be reset between samples in order to eliminate any memory of previously processed pixel data.

A first one of the inputs to comparator 221 is coupled to receive the pixel data. As specified in the drawing, the connection between the output of the multiplexer and the corresponding input of the comparator excludes sample and hold circuitry. Since no sample and hold circuit is provided here, the analog pixel data conveyed from the multiplexer on the second input as a continuous but almost constant analog signal after sufficient pixel settling. By not sampling the pixel data prior to its input into comparator 221, the impact of aliased thermal noise on the image may be reduced.

The other input to comparator 221 in the embodiment shown is a corresponding analog signal provided from CDAC 231. This signal corresponds to the digital value from SAR 233. As the contents of SAR are updated for each comparison, the corresponding analog signal from CDAC 231 is similarly updated for the next comparison/approximation performed. When a conversion is complete, the contents of SAR 233 may be conveyed to, e.g., output buffers 121 as shown in FIG. 1.

Low Noise Image Sensing with Reduced Fixed Pattern Noise (FPN)

As previously noted, embodiments of an image sensing system in which pixel data is provided to the input of comparators implemented in corresponding SAR ADCs as continuous but almost constant analog signals (and thus, without a sample and hold circuit performing a sample and hold operation) are possible and contemplated within the scope of this disclosure. As further noted, this may result in a reduction of aliased thermal noise which can reduce image quality. The present disclosure contemplates additional embodiments that may reduce noise that can have an adverse impact on a final image.

Figure 3:
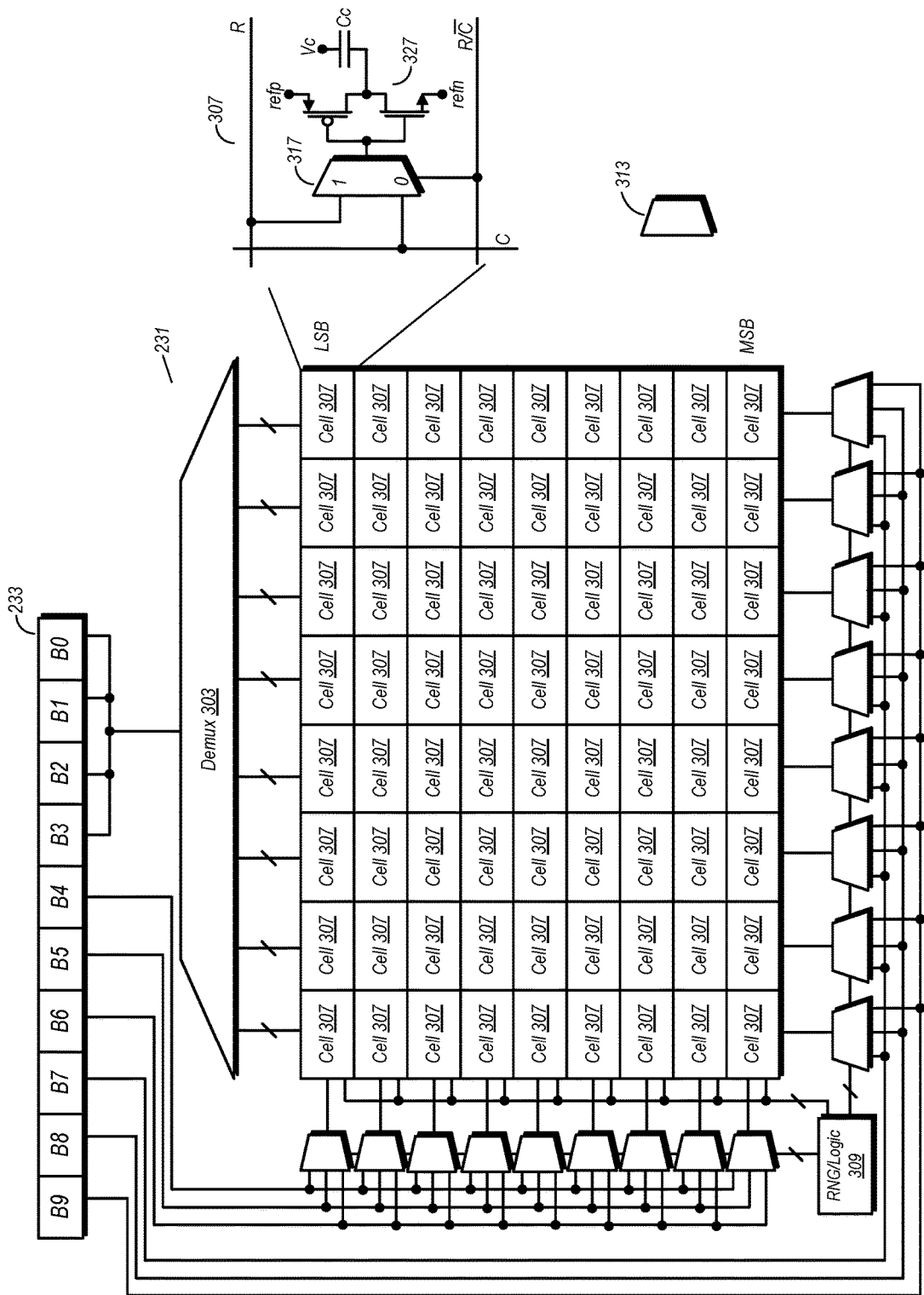
FIG. 3 is a diagram of one embodiment of a capacitive digital-to-analog converter (CDAC).

FIG. 3 illustrates one embodiment of a CDAC 231 and a correspondingly coupled SAR 233. CDAC 231 as implemented here includes an array of circuit elements, each of which is referred to here as an instance of cell 307. An example of cell 307 is shown in FIG. 3 includes a multiplexer 317 which may convey a value from either the R line or the C line to inverter 327 (shown here in a transistor implementation). Depending on the input values and the selection, the terminal capacitor Cc coupled to the output of multiplexer 317 is driven to the voltage refp, or discharged to the voltage refn. Capacitor Cc may charge or discharge accordingly, with the value Vx conveyed as part of the analog output signal from CDAC 231.

During a given conversion, not all cells are used. Instead, only certain cells are selected for use in converting the digital value stored in SAR 233 into a corresponding analog signal. In the embodiment shown, the utilized cells may be randomly selected from one iteration (e.g., for one instance of pixel data) to the next. This type of random selection may result in the averaging out of linearity errors that might otherwise be present due to mismatches of various circuit elements in CDAC 231.

The random selection may further be segmented into subsets, with the randomization within subsets being orthogonal with respect to the randomization within the other subset. In one embodiment, SAR 231 is subdivided into a first portion of storage locations coupled to provide bits to portions of the array of circuit elements associated with most significant bits (MSBs) of a digital value to be converted, and a second portion of storage locations coupled to provide bits to a portion of the array of circuit elements associated with a least significant bit (LSB) of the digital value to be converted. In this particular example, CDAC 231 is a 10-bit CDAC In this example, 10-bit CDAC that is segmented into 6-bit unary (bits B9-B4) and 4-bit binary (bits B3-B0), although this segmentation may vary from one embodiment to the next dependent upon area and target linearity budgets. For each input from pixel, cells 307 corresponding to the unary portion are randomly selected by the multiplexers 313 and grouped to form most significant bits (MSBs) output from CDAC 231. For the next input, the unary portion elements are shuffled and grouped again forming the same MSB nominal portions with different cells 307 being selected, breaking fixed pattern nonlinearity errors in the binary CDAC. In summary, cells 307 corresponding to the unary section are shuffled and the linearity errors are averaged over multiple frames to spread the INL error peaks at specific codes into other codes.

For the proposed scheme, extra randomization orthogonal to the MSB sections are introduced to the least significant bit (LSB) sections. As shown in the FIG. 3, replicas of LSB sections are instantiated and one of them is selectively chosen, with corresponding bits conveyed to the selected cells from SAR 233 through demultiplexer 303. This way extra dynamic element shuffling further reduces fixed pattern errors in CDAC 231 in the average sense over multiple frames. In this embodiment, wherein the random selection of cells is performed in subsets orthogonal to one another (for the purposes or randomization) is referred to is two-dimensional orthogonal dynamic element matching, or 2DO-DEM. It is noted however that this particular randomization scheme is but one possible way. Generally speaking, any suitable randomization scheme for cell selection including data-directed methods may be performed within the scope of this disclosure.

Control of the randomization as discussed above may be controlled by random number generator (RNG)/logic 309. These functions include random number generation which is provided to generate corresponding selection signals provided to the multiplexers 313 as well as to demultiplexer 303. In one embodiment, RNG/logic 309 is a unit of the control circuitry implemented in sensor logic/control circuitry 111 of FIG. 1. However, this circuitry may be implemented separately as well.

Figure 4:
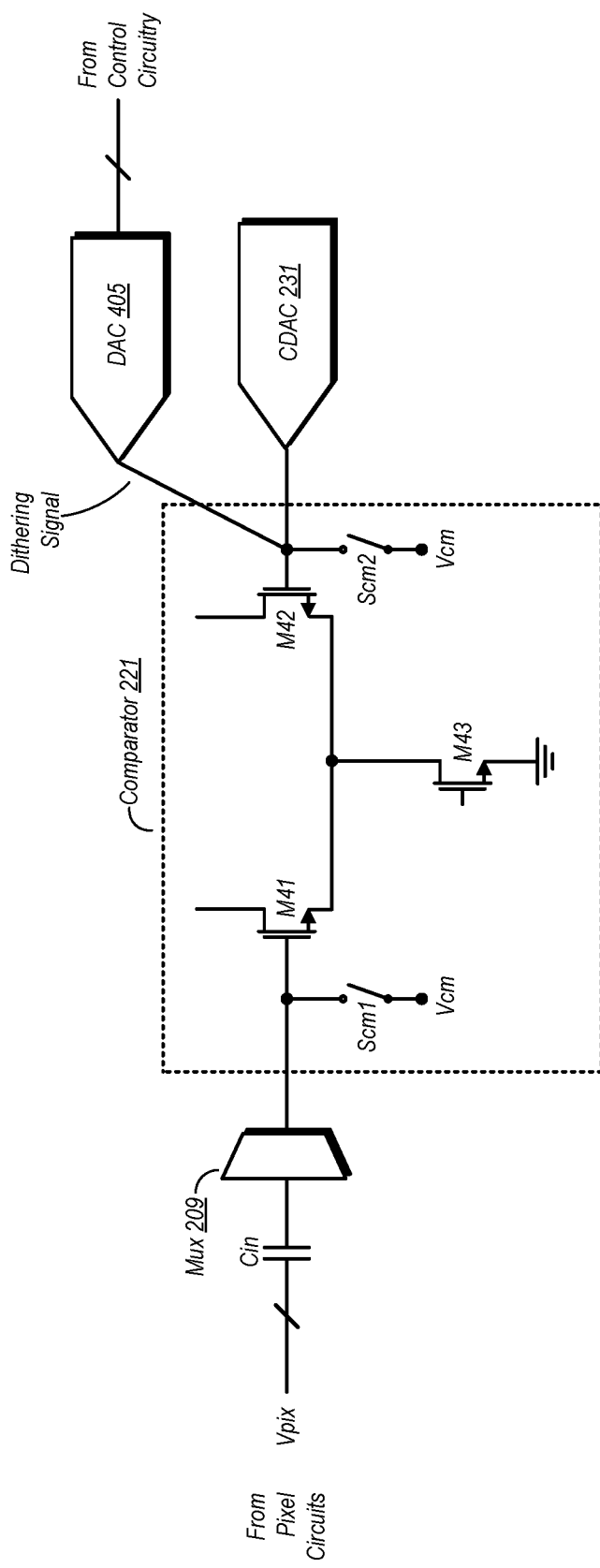
FIG. 4 is a diagram illustrating one embodiment of an apparatus coupled to convey a dithering signal to the input of an amplifier concurrent with another input signal.

FIG. 4 illustrates one embodiment of an apparatus coupled to convey a dithering signal to the input of an amplifier concurrent with another input signal. It is noted that, for the sake of illustration, only a portion of the circuitry of comparator 221 is shown. These portions include transistors M41-M43, capacitor Cin, and common mode reset switches Scm1 and Scm2, which may reset the gate terminals of their respectively coupled devices to a common mode voltage, Vcm.

In the embodiment shown, comparator 221 is coupled to receive pixel data, Vpix, via a multiplexer on a first input, via multiplexer 209. On the second input, the analog signal generated by CDAC 231 may be received. Additionally a dithering signal may also be applied to this input concurrent with application of the analog signal from CDAC 231. Generally speaking, any suitable signal generation circuitry arranged to generate a dithering signal may be provided, with the corresponding input of the comparator is being coupled to receive the dithering signal. In this particular embodiment, a second DAC 405 is provided, its output coupled to the same input of comparator 221 as is the output of CDAC 231. Control signals upon which the dithering signal is generated are provided from the control circuitry in sensor logic core/control circuitry 111 of FIG. 1 for this particular embodiment. It is noted that embodiments are possible and contemplated wherein the DAC circuitry used to generate the dithering signal may be integrated into CDAC 231, rather than as a separate DAC as shown here. However, as noted above, any suitable circuitry for generating a dithering signal may be provided in any embodiment falling within the scope of this disclosure.

The dithering signal applied to the input of comparator 221 as shown in FIG. 4 may be a random signal. Application of a random dithering signal improves differential nonlinearity (DNL) performance of the SAR ADC, particularly at small input signal ranges associated with a camera application. The dithering technique discussed herein may randomize systematic linearity errors in CDAC 231 in addition to improving DNL. Furthermore, this particular embodiment applies the dithering signal before quantization on a per-frame basis. Accordingly the dithering signal, which is the same for a given frame, is removed after performing CDS without the introduction of extra noise in the output image, while also effectively minimizing small structured errors resulting from unit mismatch in CDAC 231.

Figure 5:
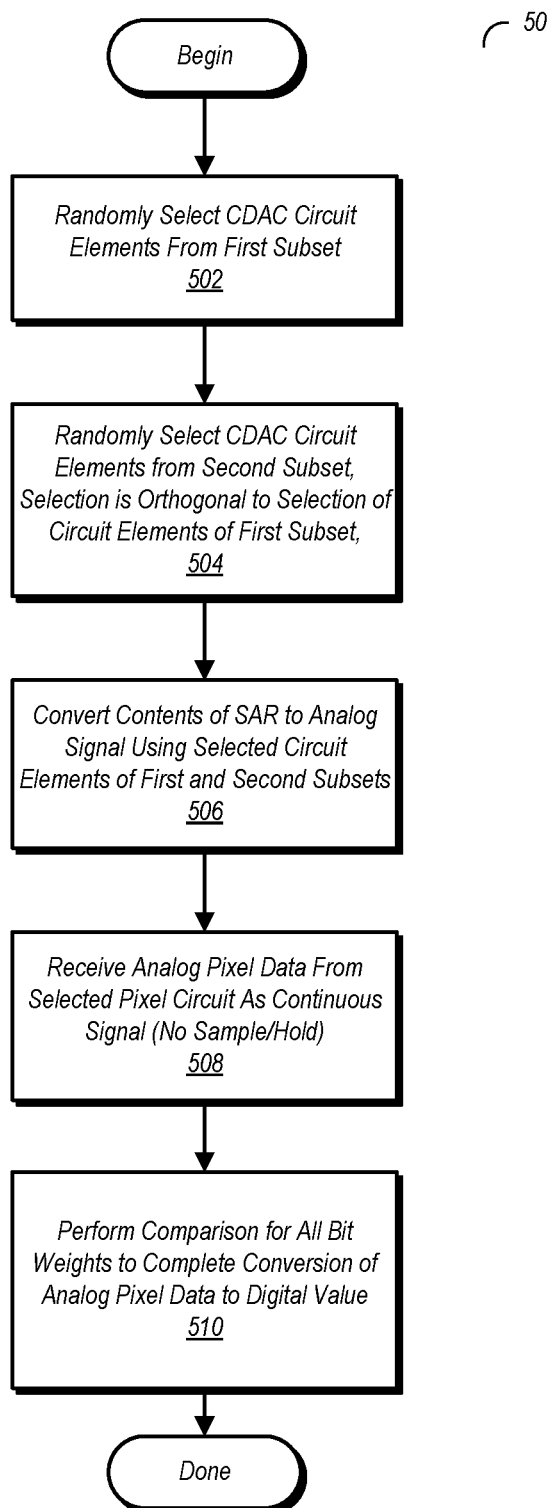
FIG. 5 is a flow diagram illustrating one embodiment of a method performing an analog-to-digital conversion in a SAR ADC having a CDAC.

FIG. 5 is a flow diagram illustrating one embodiment of a method performing an analog-to-digital conversion in a SAR ADC having a CDAC. Method 50 as disclosed herein may be provided by any of the corresponding hardware embodiments of this disclosure. Additional hardware embodiments not explicitly disclosed herein may also perform method 50, and thus may also fall within the scope of this disclosure.

Method 50 is generally directed to converting the analog pixel data into digital pixel data using a SAR ADC. The conversion of data includes the use of a CDAC, and thus includes randomly selecting CDAC circuit elements from a first subset (block 502). As shown above, the CDAC includes a two-dimensional array of circuit elements, while the converting includes the CDAC converting a digital value stored in a SAR of the SAR ADC into a corresponding analog signal. Thus, in this embodiment, converting the digital value into the corresponding analog signal comprises the control circuit causing random ones of the circuit elements being selected for generation of the corresponding analog signal, including those circuit elements of the first subset. Randomly selecting circuit elements of the first subset includes randomly selecting circuit elements associated with MSBs of the digital value stored in the SAR. Method 50 further comprises randomly selecting CDAC circuit elements from a second subset, wherein the selection of elements of the second subset is orthogonal with respect to selection of elements of the first subset (block 504). This in turn includes randomly selecting circuit elements associated with an LSB of the digital value stored in the SAR for performing the conversion to analog, and thus randomly selecting circuit elements associated with the LSB is performed orthogonally with respect to randomly selecting circuit elements associated the MSBs.

Upon selection of circuit elements of the first and second subset, method 50 further includes converting contents of the SAR to an analog signal, using the selected elements of the first and second subsets (block 506). Converting the data includes providing the corresponding analog signal (from the CDAC) to a first input of a comparator, providing the analog pixel data from the one of the plurality of pixel circuits to a second input of the comparator. This includes receiving the analog pixel data from the selected pixel circuit as a continuous signal, with no sample and hold performed (per block 508, with no sample and hold circuitry coupled to the corresponding comparator input). The conversion also includes writing a result of comparing the corresponding analog signal and the analog pixel data from an output of the comparator to the SAR (block 510). This may be done in a manner of successive approximations, in accordance with the operation of a SAR ADC.

In addition to the random selection of circuit elements within the CDAC when performing a conversion of pixel data into the digital domain, further randomization may be achieved by randomly selecting pixel circuits for which pixel data is to be converted. Returning briefly to FIG. 2, the selection of pixel circuits 103 within a pixel unit may be randomized. For the embodiment illustrated in FIG. 2, this may be referred to as column shuffling, although the disclosure herein is not limited to this type of randomization in the selection of pixel circuits.

Figure 6:
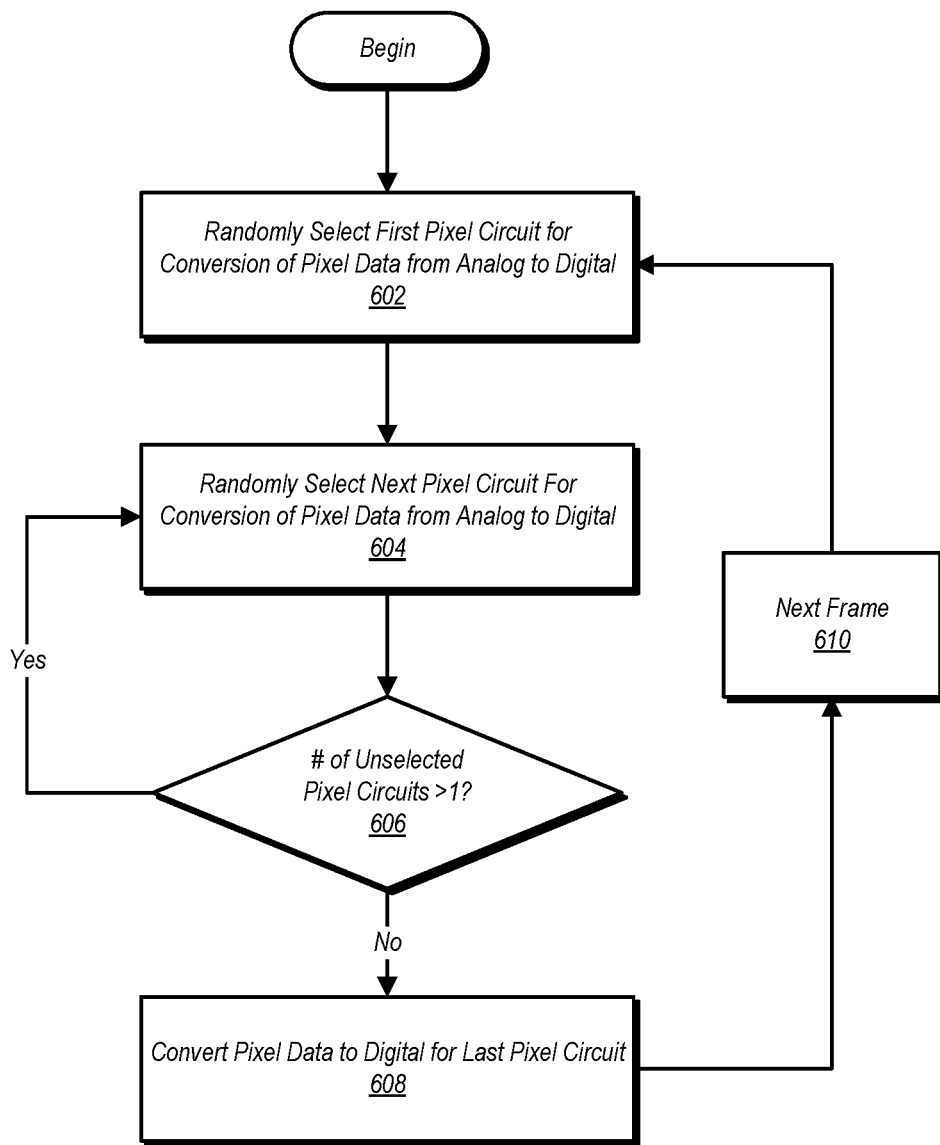
FIG. 6 is a flow diagram illustrating one embodiment of a method for selecting pixel circuits in the processing of pixel data.

FIG. 6 is a flow diagram illustrating one embodiment of a method for selecting pixel circuits in the processing of pixel data. Method 60 as shown in FIG. 6 is generally directed to the random selection of pixel circuits for the quantization of corresponding pixel data, and may apply to the embodiment of FIG. 2, as well as to other embodiments not explicitly discussed herein (but may nevertheless fall within the scope of this disclosure).

Method 60 includes randomly selecting a first pixel circuits for conversion of pixel data from analog to digital (block 602). In various embodiments, this includes randomly selecting the one of the plurality of pixel circuits to provide corresponding analog pixel data for digital conversion using a SAR ADC. Furthermore, randomly selecting may comprise a control circuit (such as that shown in FIG. 1) causing a multiplexer to select the one of the plurality of pixel circuits. After data has been quantized (e.g., converted from analog to digital) for the first selected pixel circuit, the method may randomly select the next pixel circuit for conversion of pixel data from analog to digital (block 604). After this conversion is complete, if the number of unselected pixel circuits is greater than 1 (block 606, yes), the next pixel circuit may be selected per block 604. This loop may continue until the number of unselected pixel circuits is one (block 606, no). Thereafter, pixel data from the last unselected pixel circuit is converted from analog to digital (block 608), and the method thereafter proceeds to the next frame (block 610) and repeats.

The randomization described above may reduce the effects of fixed pattern noise (FPN) which may otherwise result if the pixel circuits are selected in repetitive sequence. Randomly shuffling the sequence may reduce the FPN error to random noise.

Figure 7:
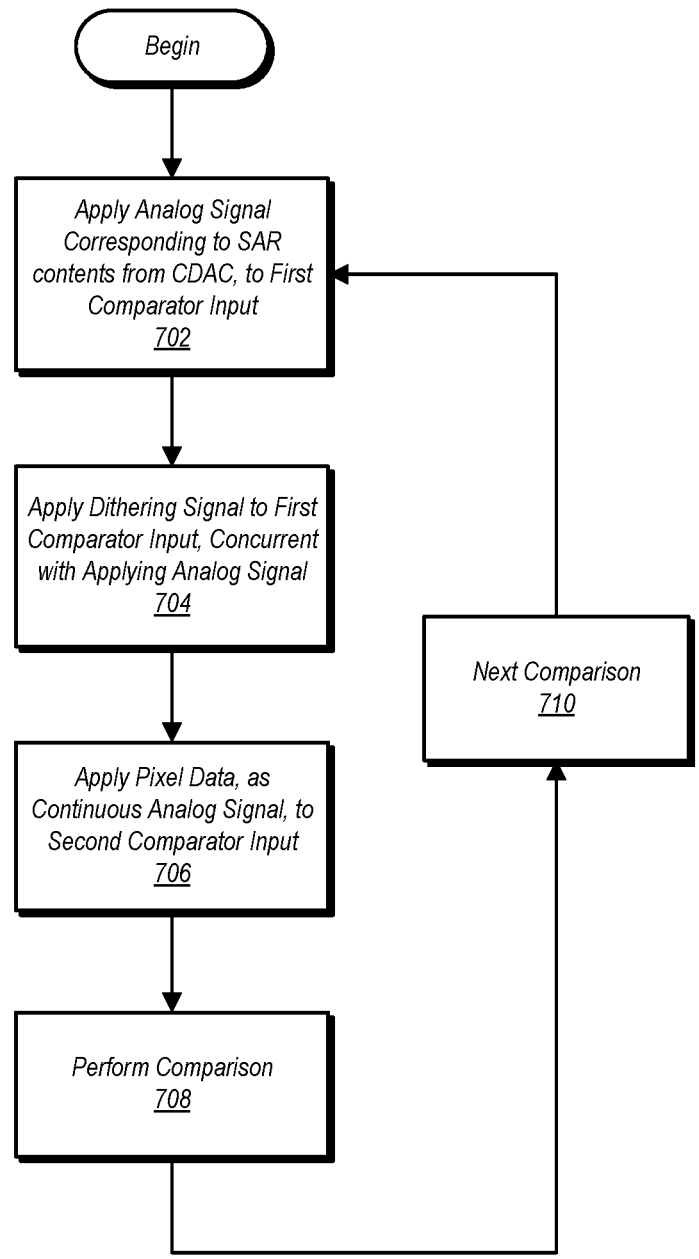
FIG. 7 is a flow diagram illustrating one embodiment of a method for performing a comparison in which a dithering signal is applied along with an input signal to one input of the comparator.

FIG. 7 is a flow diagram illustrating one embodiment of a method for performing a comparison in which a dithering signal is applied along with an input signal to one input of the comparator. Method 70 may be performed using any of the various hardware embodiments discussed herein, as well as others that, by virtue of ability to perform the method, fall within the scope of this disclosure.

Method 70 includes applying an analog signal corresponding to SAR contents from a CDAC to a first comparator input (block 702). The method further includes generating a dithering signal and applying the dithering signal to the first input of the comparator concurrent with providing the corresponding analog signal (block 704). The pixel data is applied to a second comparator input as a continuous analog signal (block 706). Based on the signals provided to the first and second inputs, a comparison of their respective amplitudes is performed (block 708), with the results of the comparison provided to the SAR as part of the successive approximation performed in converting pixel data from analog to digital. Thereafter, method 70 proceeds to the next comparison (block 710) and repeats beginning with block 702.

As previously discussed, the dithering signal may, in one embodiment, be generated by a DAC that is separate from the CDAC, or provided via extra circuitry integrated into the existing CDAC. Any other suitable signal generation circuitry may be used as well. The use of the dithering signal may improve DNL performance and thus reduce degradation to images produced by the image sensing system.

Figure 8:
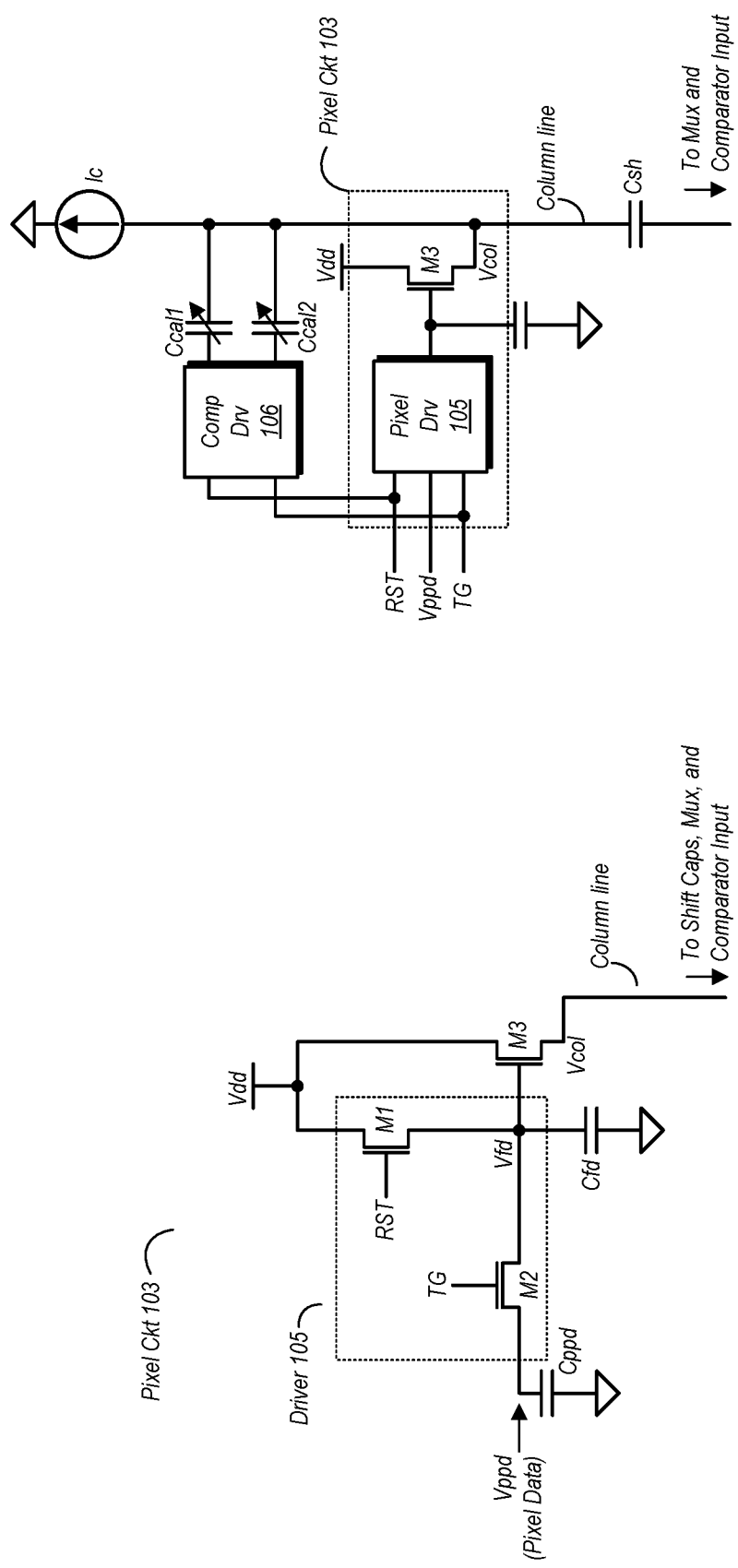
FIG. 8 is an illustration of one embodiment of a pixel circuit and compensation driver.

Circuit for Clock Feedthrough Compensation in Image Sensing Systems:

FIG. 8 is an illustration of one embodiment of a pixel circuit. Generally speaking, various embodiments of a pixel circuit as disclosed herein include a first driver circuit coupled to receive an analog pixel data, a transfer signal and a reset signal, a source follower transistor having a source terminal coupled to a column node and a gate terminal, wherein the gate terminal of the source follower is coupled to the first driver circuit and a second driver circuit coupled to receive the transfer signal and the reset signal, wherein the second driver circuit which may be shared by each column is capacitively coupled to the column node through a first capacitor.

The schematic shown in the left hand portion of FIG. 8 generally illustrates an embodiment of a pixel circuit without compensation. In the embodiment shown, driver circuit includes a reset transistor, M1, and a transfer gate, M2. The reset transistor M1 is coupled to receive a reset signal (RST), and when active, pulls the node Vfd up toward Vdd. This reset may be performed between the iterations of quantizing pixel data received and conveyed by driver 105 (shown in the box delineated by dashed lines). Assertion of the transfer gate (TG) signal activates transistor M2, thereby allowing pixel data (Vppd) to pass through the gate to node Vfd. This node is coupled to a gate terminal of transistor M3, which is coupled as a source follower to the column line (which may alternatively be referred to as the column node). Source follower M3 may amplify the pixel data that is conveyed onto the column line, where it is subsequently passed through a multiplexer to a comparator input when the pixel data from this circuit is to be quantized. Capacitors Cppd and Cfd represent capacitances existing between their respective nodes and a return path.

The right hand portion of FIG. 8 illustrates an embodiment of a pixel circuit 103 as implemented in, e.g., the pixel unit shown in FIG. 2 and a compensation circuit 106. Compensation driver 106 in this embodiment is coupled to the column lines by capacitors Ccal1 and Ccal2, although a single capacitor may be used instead. These capacitors may be adjustable or trimmable depending on the pole from the pixel driver path and zero from the compensation driver path. The capacitors block any DC voltage from compensation circuit 106, and thus the circuit is AC coupled to the column line.

As with the column lines shown in FIG. 1, that shown in FIG. 8 include a current source, Ic, to provide current on the respective signal path. For simplicity, typical pixel row selection switch between source follow (M3) and column line is not shown.

The effect of the operation of compensation driver is to provide a correlated disturbance voltage to the column line, which in turn results in faster settling time. In particular, the disturbance voltage may drive the column line (or column node) to its steady state value faster owing to the introduced zero in the feedforward path, as a result of the disturbance voltage, than would otherwise occur in the absence of the compensation driver. For a pixel driver such as that shown in the left-hand side of FIG. 8, the transitions resulting from assertion of the RST and TG signal may result in the column signal, Vcol, become disturbed from an effect known as clock feedthrough. This can introduce a non-uniform CDS residue pattern for that occurs for a certain number of pixels and corresponding column lines due to incomplete settling. The accumulated result of this may be increased FPN. By reducing the required settling time, as a result of the compensation driver, lower power may be consumed for a given noise budget, and/or noise may be reduced for a given timing budget. Further accuracy of the disturbance voltage can be attained through tuning the adjustable capacitors shown here (or single adjustable capacitor if only one is present).

Figure 9:
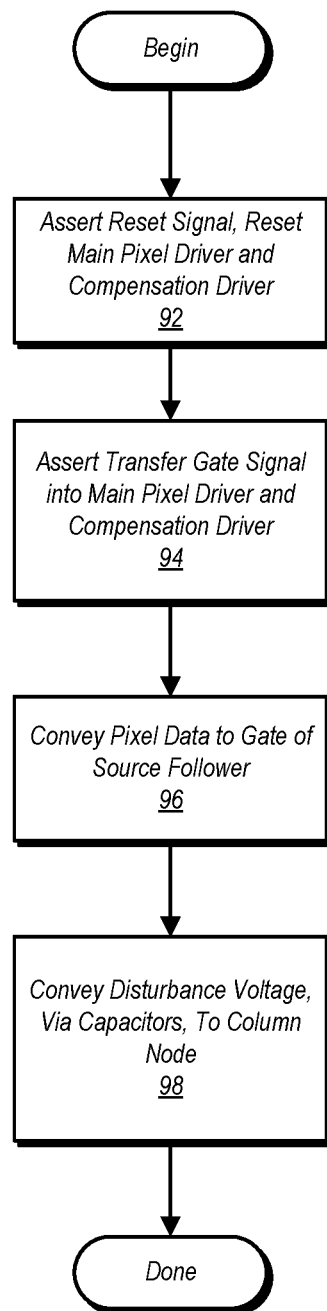
FIG. 9 is a flow diagram illustrating one embodiment of a method for operating a pixel circuit.

FIG. 9 is a flow diagram illustrating one embodiment of a method for operating a pixel circuit. Method 90 may be performed by various embodiments of the pixel circuit disclosed herein, as well as other embodiment not explicitly disclosed.

Method 90 begins with the assertion of a reset signal and performing a reset of a main pixel driver and a compensation pixel driver (block 92). In one embodiment, the main and compensation pixel drivers may have a similar or identical circuit topology, although their coupling to a column node may be different. Performing the reset includes conveying a first voltage to a gate terminal of a source follower transistor, wherein a source terminal of the source follower transistor is coupled to a column node (or column line), and conveying a second voltage to the column node, the second driver circuit being capacitively coupled to the column node. Referring back to FIG. 8, conveying the first voltage may comprise pulling the Vfd node of the main pixel driver toward Vdd. While the compensation circuit provides controlled disturbance that is pulled toward Vdd with a potential DC offset, the capacitance coupled between it and the column line blocks the transfer of DC components, and thus the second voltage is primarily an AC component related to the switching of the corresponding reset transistor.

Method 90 further includes asserting a transfer gate signal into both the main and compensation driver circuits (block 94). As a result of the assertion of the transfer gate signal, a voltage corresponding to the pixel data is conveyed to the gate terminal of a source follower coupled between the main driver and the column node (block 96). This results in another voltage being conveyed to the column node, the voltage corresponding to clock feedthrough amplified by the source follower. The method further includes conveying, responsive to assertion of the transfer gate signal, a disturbance voltage, via the capacitor(s), from the compensation driver to the column node (block 98). The disturbance voltage may include a version of the clock feedthrough voltage and controlled AC components of the transfer gate signal, and may cause settling to a steady state value to occur faster on the column node.

Note that the proposed clock feedthrough scheme can be applied to similar pixel topologies of which performance is impacted by the clock feedthrough regardless of the ADC architecture.

Figure 10:
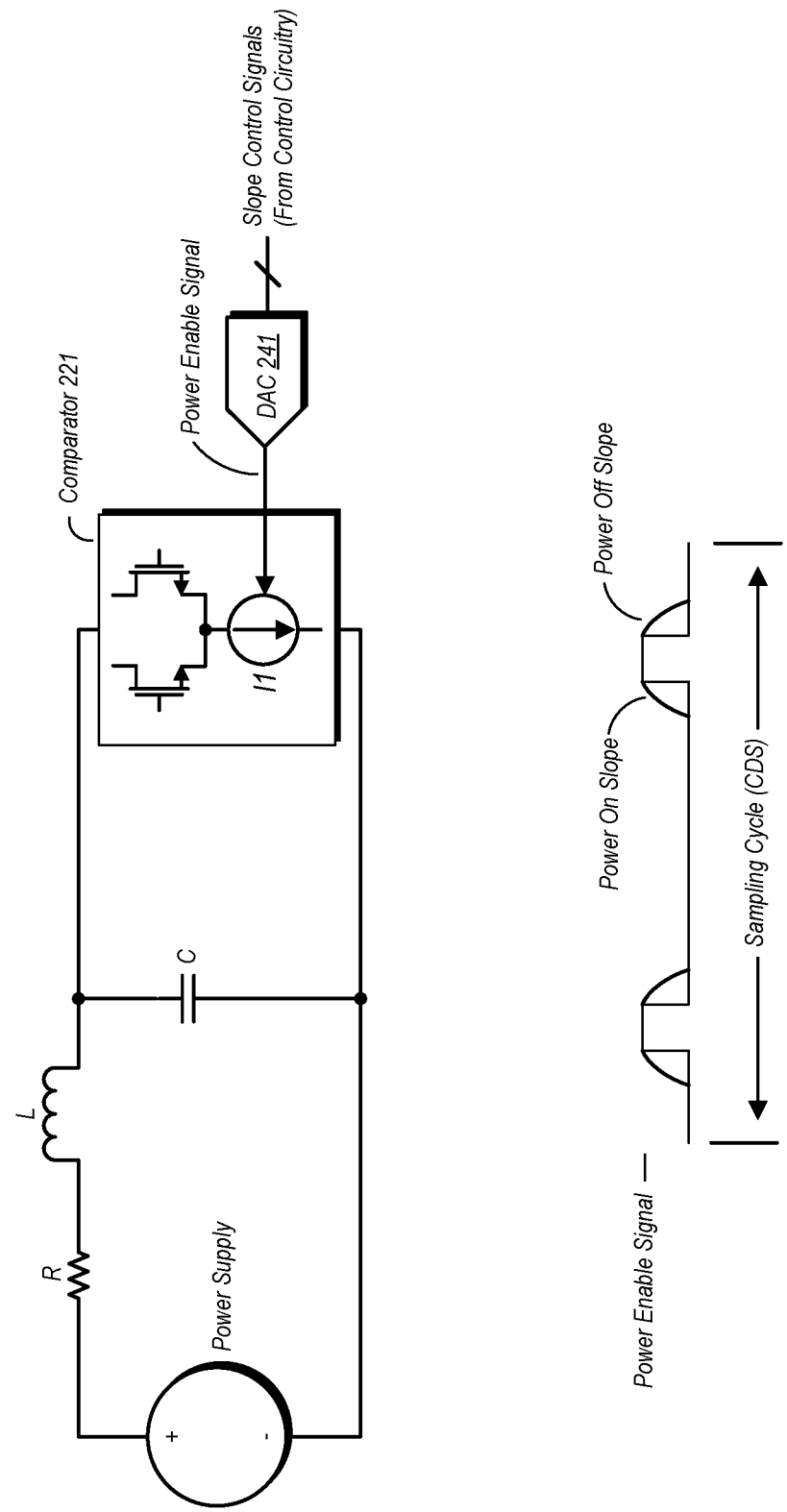
FIG. 10 is a diagram illustrating one embodiment of an apparatus for controlling the slope of a power enable signal and a diagram illustrating operation of the same.

High Speed, Low Power Image Sensing:

FIG. 10 is a diagram illustrating one embodiment of an apparatus for controlling the slope of a power enable signal and a diagram illustrating operation of the same. In the embodiment shown, comparator 221 is shown as being coupled to an RLC circuit (including a power supply, resistor R, inductor L, and a capacitor C), for the sake of illustration. The comparator 221 is part of an ADC, such as those shown in FIG. 1.

Comparator 221 in the embodiment shown includes a current source, I1, which may be implemented as a transistor or other suitable circuitry. This current source is coupled to receive a power enable signal from DAC 241. In turn, DAC 241 may receive control signal from control circuitry in, e.g., sensor logic core/control circuitry 111. These control signals may be used to control the slope of the power enable signal to provide a power up and power down sequence with minimum disturbance to the supply. DAC 241 may generate the power enable signal by converting the control signals from their received digital values into an analog signal. Comparator 221 may thus power up and power down in a manner that reduces power supply noise, as the current demand does not change as fast. This can reduce voltage droops and power supply noise that can affect image quality.

As shown in the timing diagram, the power enable signal may be used to cycle the power of the comparator during a quantization cycle. As previously noted, one embodiment of the image sensing system in which comparator 221 is implemented performs correlated double sampling, or CDS, in which data from pixel circuits is quantized twice. This may be performed under the control of the control circuitry discussed above. Within the first quantization cycle, comparator 221 may be powered on to process the reset input signal, powered down after the first quantization, powered up again for the pixel image signal, and then powered down. Accordingly, comparator 221 may be powered down during a settling time of a column line, and powered up to process the pixel output, powered down for the next settling time, and powered up for the next pixel output. Thereafter, the comparator 221 may be powered down again and remain so until the next CDS cycle. As can be seen in the diagram, the slope of the power enable signal is shaped such that the increase in current draw is smooth during the power up portion, while the decrease in current draw is smooth during the power down portion. Accordingly, power supply transients resulting from the powering on and off of comparator 221 are minimized if not eliminated. As a result, power supply noise from this power cycling is correspondingly minimized or eliminated.

In addition to controlling the shape of the power enable signal, the control circuitry in the system may also monitor for ringing that may result from powering up and powering down comparator 221. Responsive to this monitoring, the control circuitry may adjust the control signals and thus, adjust the slope of the power enable signal provided to the various instances of comparator 221 to reduce or eliminate the ringing in real time. Other factors may be monitored for as well, with the control circuitry making adjustments to the control signals, and thus the slope of the power enable signal, as needed.

Conventional power cycling, in which the slope of the power signal is not shaped based on the response or characteristic of the distributed supply and package, may result in increased power supply disturbance due to surge currents. The power cycling shown in the timing diagram as shown here may result in a reduction of both fixed pattern and random noise in the image.

In addition to the noise benefits described above, cycling the power to comparator 221 may result in reduced power consumption. In image sensing systems having a significant number of ADCs, this reduction can be significant, as the comparators may actually spend more time powered down than powered up, given that they are powered up only during processing pixel data.

Another power cycling feature that may be performed is to stagger the power enable signals to different comparators to prevent multiple comparators (or too many) from powering up at substantially the same time.

Note that the proposed system response based power enable signal slope shaping can be applied to any low power ADC architectures.

Figure 11:
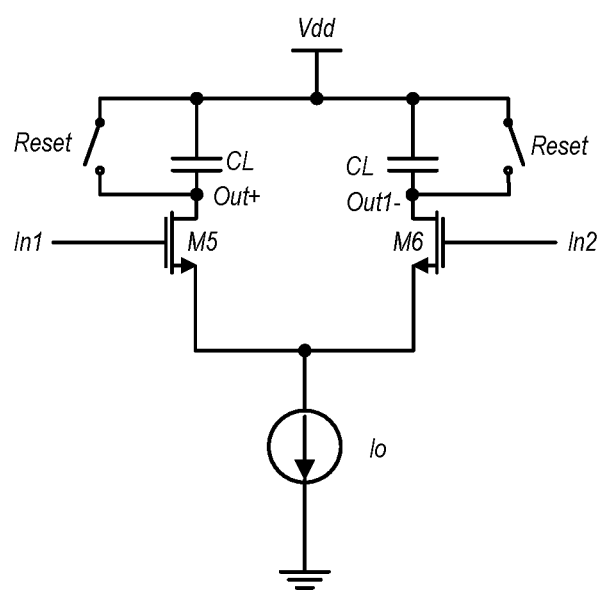
FIG. 11 is a diagram illustrating one embodiment of an integrate-and-reset pre-amplifier used in an embodiment of a comparator.

FIG. 11 is a diagram illustrating one embodiment of an integrate-and-reset pre-amplifier used in an embodiment of a low power comparator optimized for the image sensor outputs. In the embodiment shown, pre-amplifier 227 includes an amplifier having transistors M5 and M6 having respective gate terminals for receiving input signals In1 and In2. These signals may be the pixel data and analog value output from the CDAC as discussed above. A current source $I_O$ is coupled to draw current through M5 and M6. The output nodes of pre-amplifier 227 are Out+ and Out−, on the drain terminals of M5 and M6, respectively. Capacitors CL are coupled between each of the drain terminals and power supply node Vdd. A pair of reset switches ('Reset') are provided across the capacitors. These switches, when closed, may perform a reset by discharging any potential different across their respective capacitor CL. This reset may be performed periodically or as needed.

In image sensing systems, the overall readout power consumption may be dominated by a comparator pre-amplifier implemented in the ADC. In the embodiment shown in FIG. 11, the comparator pre-amplifier power may be optimized to the fundamental limit for the target signal-to-noise ratio (SNR) based on the signal processing technique. More specifically, the matched filter theory predicts that the SNR of the amplifier with input signal characteristic specific to the image sensor system (e.g. approximately DC signal) depends only on the average current applied (e.g. available energy). Therefore, the optimal comparator pre-amplifier in the image sensor ADC in terms of SNR for the given power may be the integrator and reset type structure as shown in FIG. 11. With this comparator pre-amplifier structure, the overall ADC power in the image sensor system may achieve minimum power for the given SNR specification.

Note that the pre-amplifier based on integrate-and-reset can be employed for any ADCs for low power image sensor applications.

FIG. 12 is a table illustrating repeat quantization patterns usable in one embodiment of a low power image sensing system for target RN and FPN under the constraint of fixed total quantization number. The quantization patterns shown here may be performed under the control of the control circuitry discussed above. The bit positions correspond to pixel circuits and therefore, to pixel data from these pixel circuits. In the embodiment shown, two different possible repeat patterns are shown. In the first pattern, labeled here as Rpt4, a quantization cycle (which may include performing CDS) is performed only once for bits B9, B8, B7, B5, and B4. Meanwhile, for B6 and B3-B0, quantization is repeated once for each, and thus performed twice overall in each of these positions. This pattern is referred to herein as a weighted repeat pattern, where some bits are weighted and thus their sampling process is repeated at least once.

In the second pattern, Rpt8, repeat quantization is performed for the same bits, although bits B3 and B2 are weighted more than the others. In this example, quantization for B3 and B2 are repeated three times, for a total of four quantizations each for these bits. Generally speaking, the number of repeats for a given position may be repeated any suitable number of times while reducing repeats in other bits to maintain total number of quantization.

Generally speaking, the weighted repeat methodology discussed herein may be performed in a wide variety of patterns without changing total number of quantization (hence, total energy). The weighted repeat may be used during the SAR ADC process to improve not only random noise but also bias (hence, FPN) with a small incremental hardware for the given power budget. One simple example to introduce redundancy is repeating the SAR processing multiple times for the least significant bit (LSB) to improve random noise performance. However, the blind repeat of LSB for SAR ADC in the image sensor system can cause larger fixed pattern noise. Accordingly, additional and/or different bits may be selected for repeat quantization in accordance with the various embodiments disclosed here. It is further noted that the control circuitry discussed above can change the repeat patterns if conditions warrant. Furthermore, patterns may be implemented wherein quantization of some bits are repeated once, while other bits undergo repeat quantization more than once.

Figure 13:
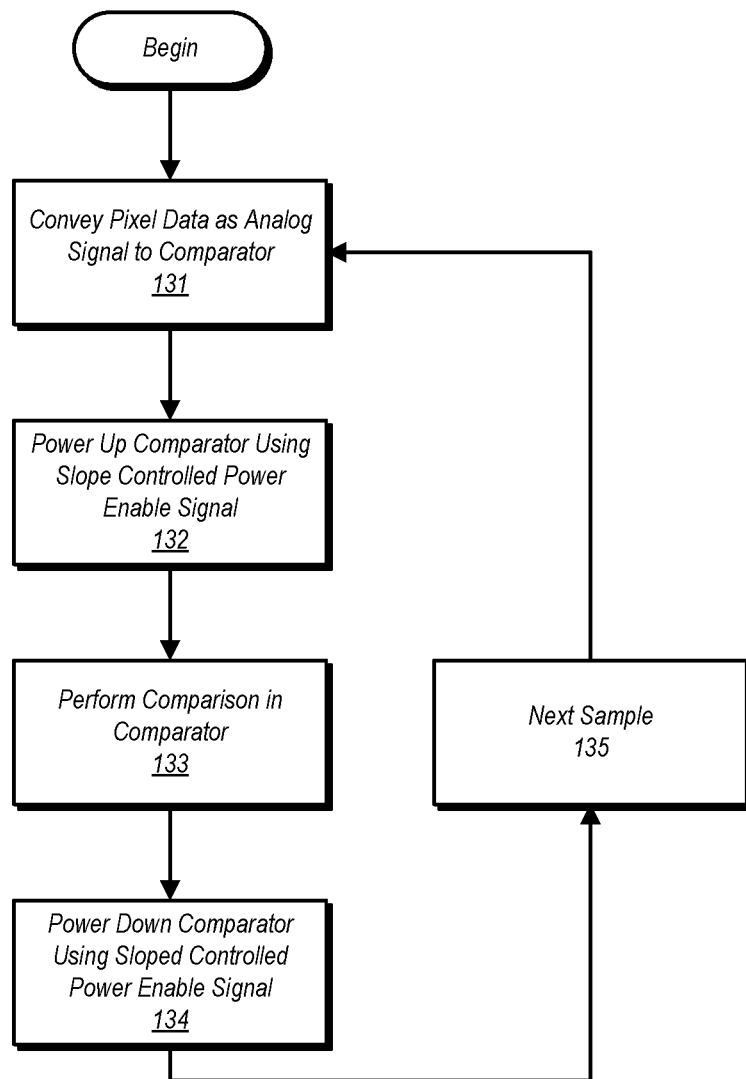
FIG. 13 is a flow diagram of one embodiment of a method for powering up and powering down a comparator using a slope-controlled power enable signal.

FIG. 13 is a flow diagram of one embodiment of a method for powering up and powering down a comparator using a slope-controlled power enable signal. Method 130 may be performed with any of the various hardware embodiments discussed herein. Image sensing system capable of performing method 130 not explicitly discussed herein may nevertheless fall within the scope of this disclosure.

Method 130 begins with the conveying of pixel data as an analog signal to a comparator (block 131). The pixel data may be conveyed from a pixel circuit that is selected according to control signals (e.g., selection signals) provided by control circuitry. The pixel data may be conveyed through a multiplexer to the comparator of a SAR ADC. The control circuitry may also power up the comparator to which the pixel data is conveyed, using a slope controlled power enable signal (block 132). The shape of the power enable signal may, in one embodiment, be controlled based on control signals conveyed from the control circuitry to a DAC.

With the DAC powered on, the comparison may be performed (block 133), the result thereof being stored in a SAR of a SAR DAC. Upon completing the quantization, the control circuit may cause the comparator to be powered down again under the control of the slope controlled power enable signal (block 134). Thereafter, the method proceeds to the next quantization (block 135) and repeats.

Figure 14:
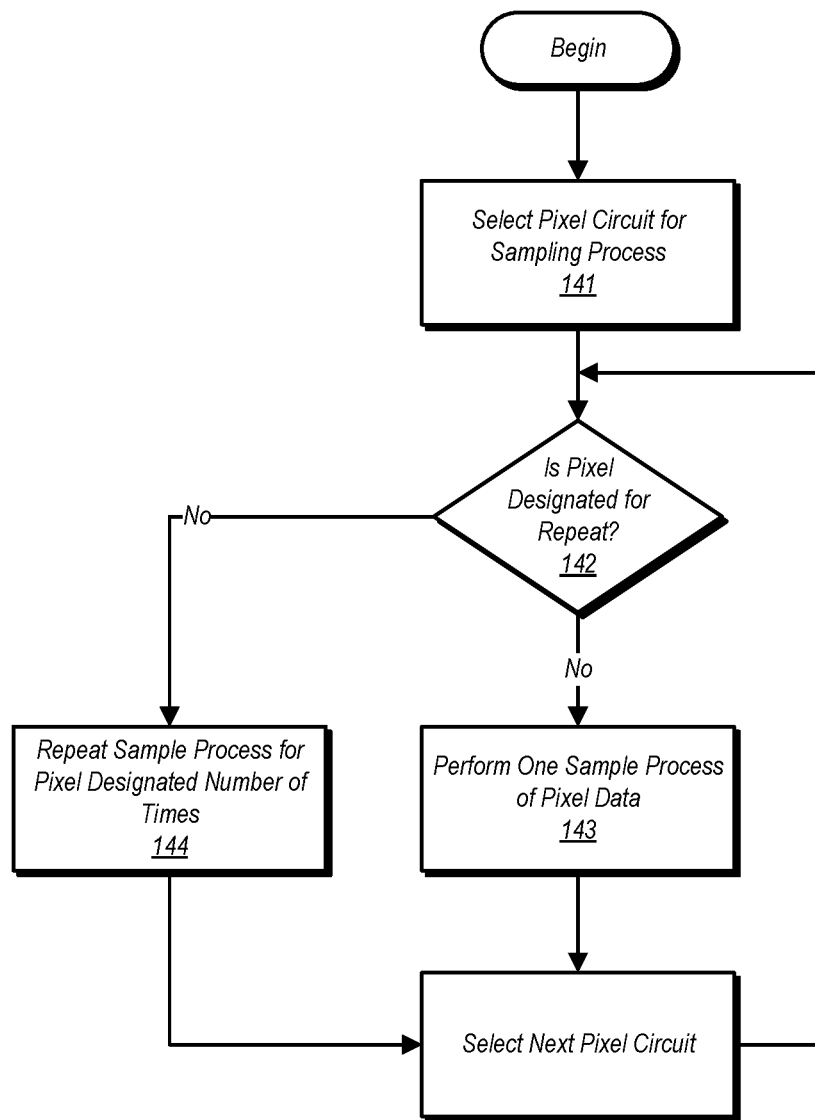
FIG. 14 is a flow diagram illustrating one embodiment of a method for selectively repeating a sampling process for particular ones of a number of pixel circuits.

FIG. 14 is a flow diagram illustrating one embodiment of a method for selectively repeating a quantization process for particular ones of a number of pixel circuits. Method 140 may be performed by any of the embodiments of an image sensing system disclosure herein, as well as others not explicitly disclosed herein but nevertheless falling within this disclosure's scope.

Method 140 may be performed using either of the repeat patterns shown in FIG. 12, or other patterns not explicitly discussed herein. The method begins with the selection of a pixel circuit for performing a quantization process of pixel data (block 141). If the pixel circuit is one that is designated for a repeat (block 142, yes), the quantization process (which may include CDS) maybe repeated the designated number of times (block 144). If the pixel is not one designated for repeat quantization (block 142, no), one quantization process of the pixel data is performed (block 143). After quantization of the designated pixel data is complete, the next pixel circuit is selected, and the method repeats from block 142.

Figure 15:
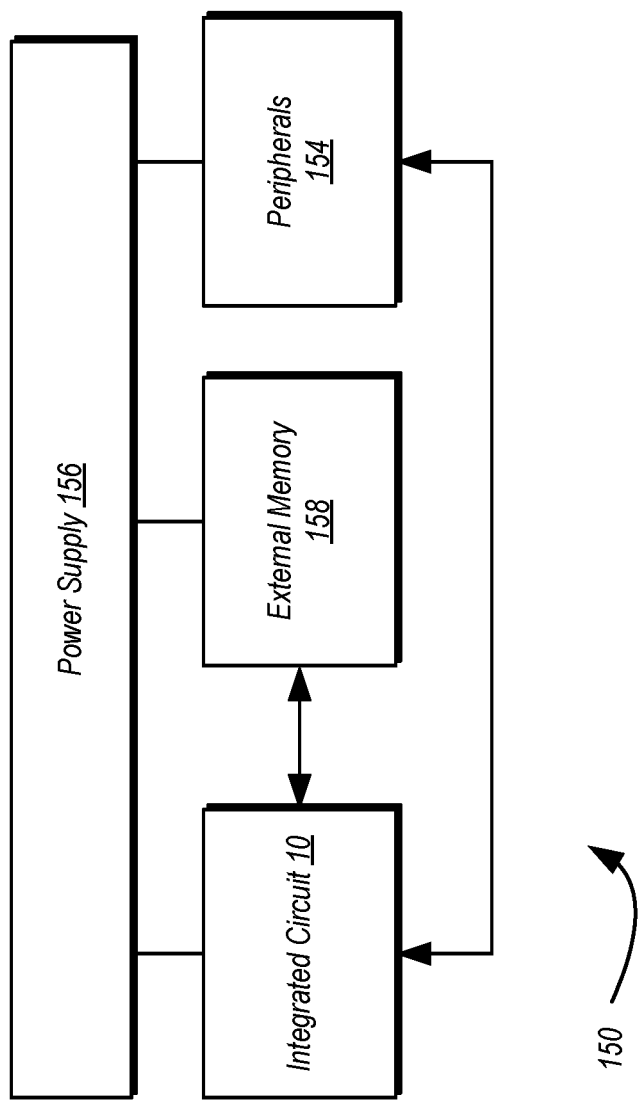
FIG. 15 is a block diagram of one embodiment of an example system.

Turning next to FIG. 15, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

Various embodiments of the IC 10 and/or peripherals 154 may include circuitry for implementing one of the various image sensing systems discussed above. As shown in FIG. 1, portions of the system may be on different chips, although implementations wherein the entirety of the image sensing system is implemented on a single chip are possible and contemplated.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
    a first driver circuit coupled to receive a transfer signal and a reset signal;
    a source follower transistor having a source terminal coupled to a column node and a gate terminal, wherein the gate terminal of the source follower is coupled to the first driver circuit; and
    a second driver circuit coupled to receive the transfer signal and the reset signal, wherein the second driver circuit is capacitively coupled to the column node through a first capacitor.

2. The circuit as recited in claim 1, wherein the first driver circuit includes a first reset transistor and a first transfer gate, and wherein the second driver circuit includes buffer stages or duplicated first driver circuit implemented with a second reset transistor and a second reset gate.

3. The circuit as recited in claim 2, wherein the first reset transistor is configured to be activated responsive to assertion of the reset signal, and wherein responsive to the assertion of the reset signal, the first reset transistor is configured to pull a voltage on the gate terminal of the source follower toward a supply voltage on a supply voltage node.

4. The circuit as recited in claim 2, wherein the second reset transistor is configured to be activated responsive to assertion of the reset signal, wherein responsive to assertion of the reset signal, the second reset transistor is configured to pull an internal node of the second driver circuit toward a supply voltage on a supply voltage node.

5. The circuit as recited in claim 2, wherein the first transfer gate is configured to transfer analog pixel data to the gate terminal of the source follower responsive to assertion of the transfer signal, wherein the source follower is configured to amplify a magnitude of the analog pixel data on the column node.

6. The circuit as recited in claim 2, wherein the second transfer gate is configured to transfer, via capacitive coupling, a disturbance voltage to the column node responsive to activation of the transfer signal.

7. The circuit as recited in claim 1, wherein the second driver is capacitively coupled to the column node by one or more adjustable capacitors.

8. The circuit as recited in claim 1, wherein the column node is coupled to an input of a multiplexer, and wherein an output of the multiplexer is coupled to an analog-to-digital converter (ADC).

9. A method comprising:
asserting a reset signal;
conveying, from a first driver circuit and in response to assertion of a reset signal, a first voltage to a gate terminal of a source follower transistor, wherein a source terminal of the source follower transistor is coupled to a column node;
conveying, from a second driver circuit and in response to assertion of the reset signal, a second voltage to the column node, the second driver circuit being capacitively coupled to the column node;
asserting a transfer signal;
conveying, from the first driver circuit and in response to assertion of a transfer signal, a third voltage to the gate terminal of the source follower transistor; and
conveying, from the second driver circuit and in response to assertion of the transfer signal, a fourth voltage to the column node.

10. The method as recited in claim 9, wherein conveying the first voltage to the gate terminal of the source follower transistor comprises pulling the first voltage on the gate terminal of the source follower transistor toward a supply voltage present on a supply node.

11. The method as recited in claim 9, wherein conveying the second voltage to the column node comprises conveying a supply voltage to a capacitance coupled between the second driver circuit and the column node.

12. The method as recited in claim 9, wherein conveying a third voltage comprises the driver circuit conveying pixel data to the gate terminal of the source follower.

13. The method as recited in claim 9, wherein conveying the fourth voltage comprises the driver circuit conveying a controlled disturbance voltage to a capacitance coupled between the second driver circuit and the column node.

14. The method as recited in claim 9, further comprising conveying an analog signal on the column node to an analog-to-digital converter, and converting the analog signal into a digital value.

15. A system comprising:
a plurality of pixel units configured to receive pixel data and convert the pixel data into a digital format, wherein ones of the pixel units includes a plurality of pixel circuits and an analog-to-digital converter (ADC), wherein the ones of the plurality of pixel circuits include:
a pixel driver circuit coupled to receive a transfer signal and a reset signal;
a source follower transistor having a source terminal coupled to a column node and a gate terminal, wherein the gate terminal of the source follower is coupled to the pixel driver circuit; and
a compensation circuit coupled to receive the transfer signal and the reset signal, wherein the compensation circuit is capacitively coupled to the column node through a capacitor.

16. The system as recited in claim 15, wherein the pixel driver circuit of ones of the plurality of pixel circuits includes a first reset transistor and a first transfer gate, and wherein the compensation circuit includes a second reset transistor and a second transfer gate, wherein the first and second reset transistors are configured to be activated responsive to assertion of a reset signal, and wherein the first and second transfer gates are configured to be activated responsive to assertion of a transfer signal.

17. The system as recited in claim 16, wherein the first reset transistor is configured to, when active, pull a voltage on the gate terminal of the source follower transistor toward a supply voltage on a supply voltage node, and wherein the second reset transistor is configured to, when active, pull a first terminal of the capacitor toward the supply voltage.

18. The system as recited in claim 16, wherein the first transfer gate is configured to, when active, transfer pixel data to the gate terminal of the source follower transistor.

19. The system as recited in claim 18, wherein the capacitor is an adjustable capacitor configured to convey a controlled disturbance voltage onto the column node responsive to the compensation circuit receiving the transfer signal.

20. The system as recited in claim 18, further comprising the source follower transistor amplifying a voltage of the pixel data on the column node.

* * * * *